(12) United States Patent
Goss

(10) Patent No.: US 11,848,055 B2
(45) Date of Patent: Dec. 19, 2023

(54) ASYNCHRONOUS ACCESS MULTI-PLANE SOLID-STATE MEMORY

(71) Applicant: Seagate Technology LLC, Fremont, CA (US)

(72) Inventor: Ryan James Goss, Prior Lake, MN (US)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 17/406,346

(22) Filed: Aug. 19, 2021

(65) Prior Publication Data

US 2022/0059171 A1    Feb. 24, 2022

Related U.S. Application Data

(60) Provisional application No. 62/706,509, filed on Aug. 21, 2020.

(51) Int. Cl.
*G11C 16/16* (2006.01)
*G11C 16/08* (2006.01)
*G11C 16/30* (2006.01)
*G11C 16/28* (2006.01)

(52) U.S. Cl.
CPC ......... *G11C 16/16* (2013.01); *G11C 16/08* (2013.01); *G11C 16/28* (2013.01); *G11C 16/30* (2013.01)

(58) Field of Classification Search
CPC ................................................. G11C 16/32
See application file for complete search history.

(56) References Cited

U.S. PATENT DOCUMENTS

| | | |
|---|---|---|
| 8,213,255 B2 | 7/2012 | Hemink et al. |
| 8,804,435 B2 | 8/2014 | Matsunaga |
| 9,076,545 B2 | 7/2015 | Mokhlesi |
| 10,002,671 B2* | 6/2018 | Shimizu ............... G11C 16/26 |
| 2019/0227749 A1 | 7/2019 | Wakchaure et al. |
| 2020/0004455 A1* | 1/2020 | Williams ............ G06F 12/0246 |
| 2020/0004674 A1* | 1/2020 | Williams ............... G06N 20/00 |

* cited by examiner

*Primary Examiner* — Kretelia Graham
(74) *Attorney, Agent, or Firm* — Hall Estill Law Firm; Randall K. McCarthy

(57) ABSTRACT

A solid-state memory may have many non-individually erasable memory cells arranged into dies with each die having a first plane and a second plane. Receipt of a single read command from a host connected to the solid-state memory can prompt generation of a first reference voltage and a second reference voltage by the controller to produce asynchronous data retrieval. The reference voltages can be different and selected by the controller to induce a predetermined delay between retrieval of data from the first plane and retrieval of data from the second plane from the single read command. Passage of each reference voltage concurrently to a common single data address of the first plane and the second plane may produce asynchronous retrieval of data from the respective first plane and second plane.

20 Claims, 8 Drawing Sheets

ASYNCHRONOUS ACCESS MULTI-PLANE SOLID-STATE MEMORY

CROSS-REFERENCE TO RELATED APPLICATIONS

This application claims benefit under 35 U.S.C. 119(e) of U.S. Provisional Application Ser. No. 67/706,509, filed Aug. 21, 2020, which is hereby expressly incorporated herein by reference in its entirety.

SUMMARY

Various embodiments of the present disclosure are generally directed to the management of errors in a memory, such as, but not limited to, a flash memory in a solid state drive (SSD).

A solid-state memory, in some embodiments, has many non-individually erasable memory cells arranged into dies with each die having a first plane and a second plane. A controller forwards a read command to a die to simultaneously read data from at least one memory cell of the first plane and at least one memory cell of the second plane in response to a single data address. The read command consists of a first read voltage for the first plane and a different, second read voltage for the second plane with the respective read voltages selected by the controller to induce a predetermined delay between retrieval of data from the first plane and retrieval of data from the second plane.

Other embodiments utilize a solid-state memory that has many non-individually erasable memory cells arranged into dies with each die having a first plane and a second plane. Receipt of a single read command from a host connected to the solid-state memory prompts generation of a first reference voltage and a second reference voltage by the controller to produce asynchronous data retrieval. The reference voltages are different and selected by the controller to induce a predetermined delay between retrieval of data from the first plane and retrieval of data from the second plane from the single read command. Passage of each reference voltage concurrently to a common single data address of the first plane and the second plane produces asynchronous retrieval of data from the respective first plane and second plane.

Utilization of a solid-state memory, in accordance with various embodiments, arrange the memory into dies with each die having a first plane and a second plane. Receipt of a single read command from a host connected to the solid-state memory prompts generation of a first reference voltage and a second reference voltage by the controller to produce asynchronous data retrieval. The reference voltages are different and selected by the controller to induce a predetermined delay between retrieval of data from the first plane and retrieval of data from the second plane from the single read command. Passage of each reference voltage concurrently to a common single data address of the first plane and the second plane produces asynchronous retrieval of data from the respective first plane and second plane. The controller generates an optimization strategy in response to receipt of the single read command and executes the optimization strategy to test a reference voltage for at least one memory cell of the first plane and at least one memory cell of the second plane concurrently.

DETAILED DESCRIPTION

Figure 1:
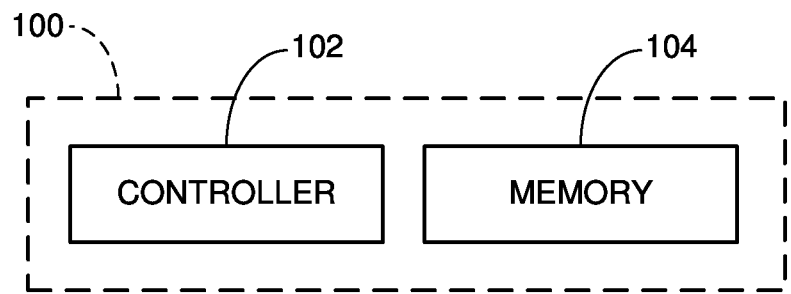
FIG. 1 provides a functional block representation of a data storage device in accordance with various embodiments.

Without limitation, embodiments disclosed herein are directed to providing optimal data access performance in a solid-state memory employing multiple planes of memory cells.

Solid state drives (SSDs) are data storage devices that store user data in non-volatile memory (NVM) made up of an array of solid-state semiconductor memory cells. SSDs usually have an NVM module and a controller. The controller controls the transfer of data between the NVM and a host device. The NVM will usually be NAND flash memory, but other forms of solid-state memory can be used.

A flash memory module may be arranged as a series of dies. A die represents a separate, physical block of semiconductor memory cells. The controller communicates with the dies using a number of channels, or lanes, with each channel connected to a different subset of the dies. Any respective numbers of channels and dies can be used. Groups of dies may be arranged into NVMe sets in accordance with the NVMe (Non-Volatile Memory Express) Standard. This standard enables multiple owners (users) to access and control separate portions of a given SSD (or other memory device).

Metadata is often generated and used to describe and control the data stored to an SSD. The metadata may take the form of one or more map structures that track the locations of data blocks written to various GCUs (garbage collection units), which are sets of erasure blocks that are erased and allocated as a unit. The map structures can include a forward map and a reverse directory, although other forms can be used.

The forward map provides an overall map structure that can be accessed by a controller to service a received host access command (e.g., a write command, a read command, etc.). The forward map may take the form of a two-level map, where a first level of the map maintains the locations of map pages and a second level of the map provides a flash transition layer (FTL) to provide association of logical addresses of the data blocks to physical addresses at which the blocks are stored. Other forms of maps can be used including single level maps and three-or-more level maps, but each generally provides a forward map structure in which pointers may be used to point to each successive block until the most current version is located.

The reverse directory can be written to the various GCUs and provides local data identifying, by logical address, which data blocks are stored in the associated GCU. The reverse directory, also sometimes referred to as a footer, thus provides a physical to logical association for the locally stored blocks. As with the forward map, the reverse directory can take any number of suitable forms. Reverse directories are particularly useful during garbage collection operations, since a reverse directory can be used to determine which data blocks are still current and should be relocated before the associated erasure blocks in the GCU are erased.

SSDs expend a significant amount of resources on maintaining accurate and up-to-date map structures. Nevertheless, it is possible from time to time to have a mismatch between the forward map and the reverse directory for a given GCU. These situations are usually noted at the time of garbage collection. For example, the forward map may indicate that there are X valid data blocks in a given erasure block (EB), but the reverse directory identifies a different number Y valid blocks in the EB. When this type of mismatch occurs, the garbage collection operation may be rescheduled or may take a longer period of time to complete while the system obtains a correct count before proceeding with the recycling operation.

The NVMe specification provides that a storage device should have the ability to provide guaranteed levels of deterministic performance for specified periods of time (deterministic windows, or DWs). To the extent that a garbage collection operation is scheduled during a DW, it is desirable to ensure that the actual time that the garbage collection operation would require to complete is an accurate estimate in order for the system to decide whether and when to carry out the GC operation.

SSDs include a top level controller circuit and a flash (or other semiconductor) memory module. A number of channels, or lanes, are provided to enable communications between the controller and dies within the flash memory. The dies are further subdivided into planes, GCUs, erasure blocks, pages, etc. Groups of dies may be arranged into separate NVMe sets, or namespaces. This allows the various NVMe sets to be concurrently serviced for different owners (users).

In one nonlimiting example, a 4 TB SSD has 128 die connected using 8 channels so that 16 die are connected to each channel. Each die has two planes that support concurrent read or write operations to the same page number (but not necessarily the same erasure blocks, EBs). GCUs nominally are formed using one EB from each of 32 dies. Each page stores 16 K of data plus LDPC inner code values. GCU writes are thus formed by writing (nominally) 31 pages of user data, and one page of parity (XOR) data. This will support a loss of a single die. EBs represent the smallest increment of memory that can be erased as a unit, but in practice, garbage collection takes place at the GCU level.

Flash devices can be noisy and thus it is common to write data in the form of code words to individual pages of data. A page may store 16 K worth of user payload data, plus some additional number of LDPC (low density parity check) codes, which may be on the order of an additional 5 K or so bits. The number and strength of the LDPC codes are used to enable, normally, correct reading back of the payload. Outercode, or parity values, can additionally be written as noted above to correct read errors when the inner code values are insufficient to resolve the error.

Despite the ability to correct errors, the efficient utilization of memory in a solid-state data storage device remains important. With some solid-state memories having a finite lifespan tied to a number of read, write, and erase cycles, such as flash memory, the efficient utilization of memory cells is even more important. The physical capability of positioning numerous memory cells in a relatively small package allows the memory to be employed in a diverse variety of computing devices and environments, but can result in inefficient data access activity. For example, limited channels may be available in small physical packages for data signals to be transferred to, and from, memory cells, which prompts single data access commands to be used to prompt data access activity in multiple different regions of memory cells. However, such single data access command usage can pose operational difficulties that result in suboptimal memory operation.

Accordingly, embodiments of a solid-state memory configure a die of memory cells arranged into different planes to be accessed asynchronously with a single data access command. The ability to utilize different planes of a die of solid-state memory for customized data storage purposes and subsequently for customized data retrieval purposes allows a single data access command to provide optimized data storage and reading performance.

These and other features may be practiced in a variety of different data storage devices, but various embodiments conduct wear range optimization in the example data storage device 100 shown as a simplified block representation in FIG. 1. The device 100 has a controller 102 and a memory module 104. The controller block 102 represents a hardware-based and/or programmable processor-based circuit configured to provide top level communication and control functions. The memory module 104 includes solid state non-volatile memory (NVM) for the storage of user data from one or more host devices 106, such as other data storage devices, network server, network node, or remote controller.

Figure 2:
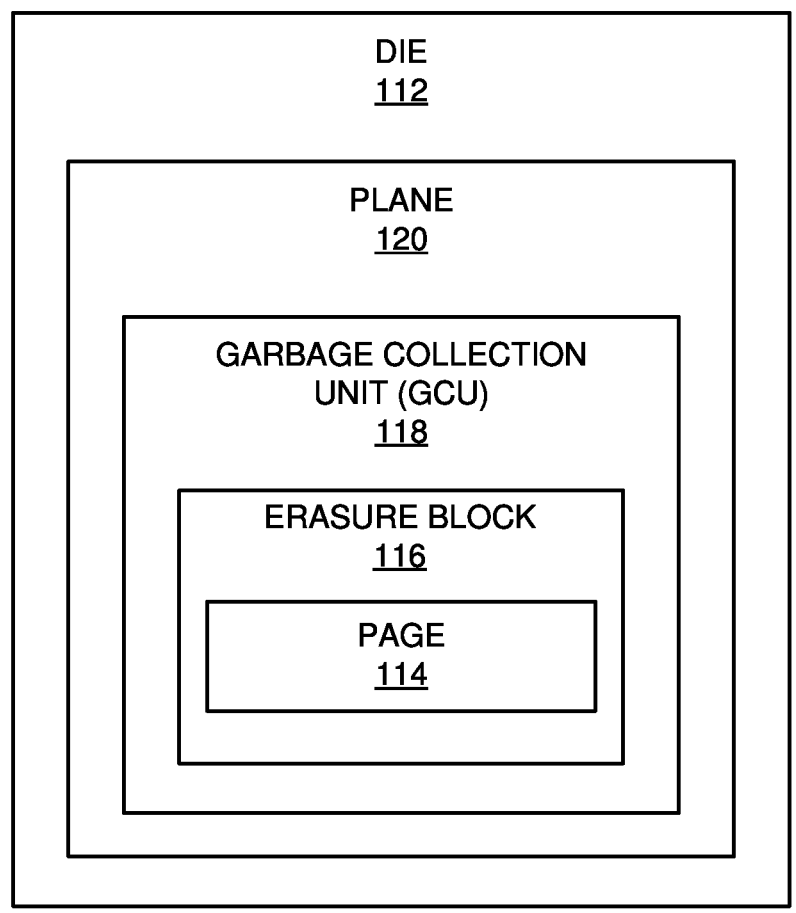
FIG. 2 shows aspects of the device of FIG. 1 characterized as a solid state drive (SSD) in accordance with some embodiments.

FIG. 2 shows a block representation of portions of an example memory 110 arranged in accordance with some embodiments. A memory die 112 can be configured with any solid-state memory cells, such as flash, resistive, phase change, and spin-torque memory, without limitation. The smallest unit of memory that can be accessed at a time is referred to as a page 114. A page 114 may be formed using a number of solid-state memory cells that share a common word line, bit line, or source line. The storage size of a page 114 can vary; current generation flash memory pages can store, in some cases, 16 KB (16,384 bytes) of user data.

A number of pages are integrated into an erasure block 116, which represents the smallest grouping of memory cells that can be concurrently erased in a NAND flash memory. A number of erasure blocks 116 can be arranged into a garbage collection unit (GCU) 118, which may utilize erasure blocks across different dies 112, as explained below. GCUs 118 can be allocated for the storage of data. Once a sufficient amount of the stored data is determined to be stale (e.g., no longer the most current version), a garbage collection operation can be carried out to recycle the GCU 118. This includes identifying and relocating the current version data to a new location, followed by an erasure operation to reset the memory cells. The GCU 118 may then be returned to an allocation pool for subsequent allocation to begin storing new user data.

Each die 112 may include a plurality of planes 120. Examples include two planes per die, four planes per die, etc. although other arrangements can be used. Generally, a plane is a subdivision of the die 112 arranged with separate read/write/erase circuitry such that a given type of access operation (such as a write operation, etc.) can be carried out simultaneously by each of the planes to a common page address within the respective planes.

Figure 3:
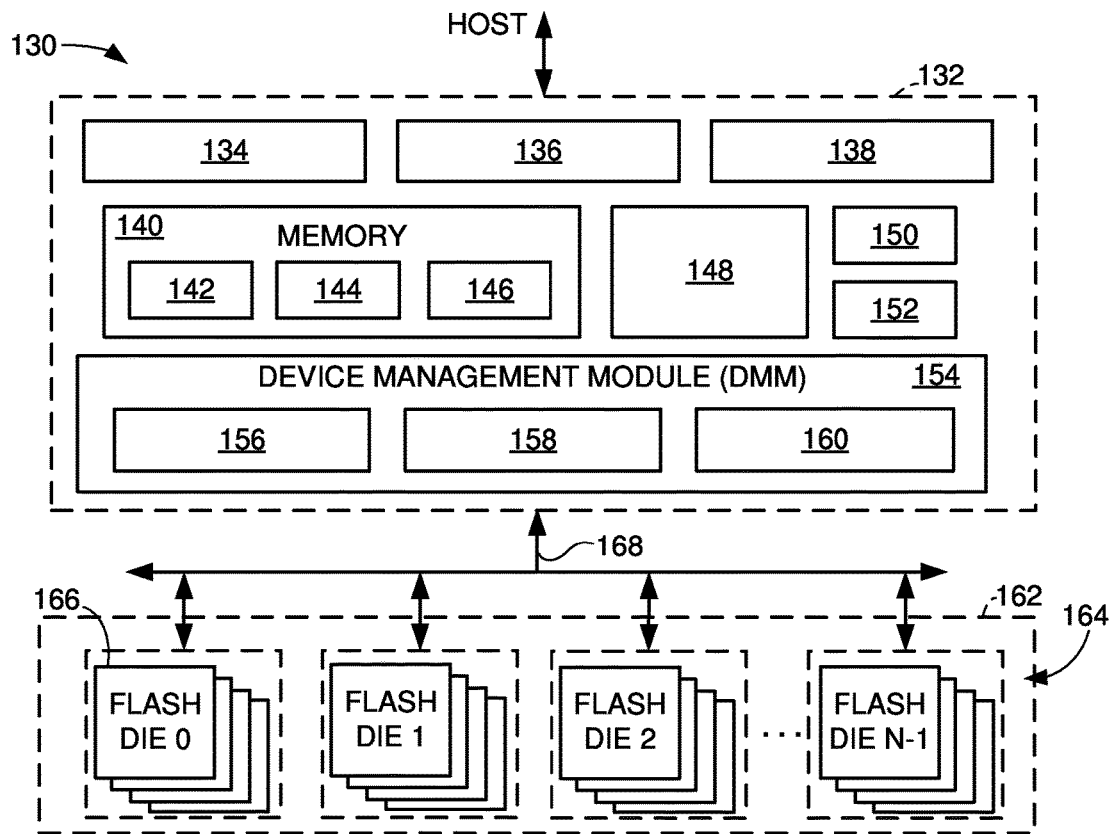
FIG. 3 shows an arrangement of the flash memory of FIG. 2 in some embodiments.

FIG. 3 depicts portions of an example data storage device 130 generally corresponding to the device 100 in FIG. 1. The device 130 is configured as a solid state drive (SSD) that communicates with one or more host devices via one or more Peripheral Component Interface Express (PCIe) ports, although other configurations can be used. The NVM is contemplated as comprising NAND flash memory, although other foul's of solid state non-volatile memory carp be used.

In at least some embodiments, the SSD operates in accordance with the NVMe (Non-Volatile Memory Express) Standard, which enables different users to allocate NVMe sets (die sets) for use in the storage of data. Each NVMe set may form a portion of an NVMe Namespace that may span multiple SSDs or be contained within a single SSD.

The SSD 130 includes a controller circuit 132 with a front end controller 134, a core controller 136 and a back end controller 138. The front end controller 134 performs host I/F functions, the back end controller 138 directs data transfers with the memory module 134 and the core controller 136 provides top level control for the device.

Each controller 134, 136 and 138 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 140 represents various forms of volatile and/or non-volatile memory (e.g., SRAM, DDR DRAM, flash, etc.) utilized as local memory by the controller 132. Various data structures and data sets may be stored by the memory including one or more map structures 142, one or more caches 144 for map data and other control information, and one or more data buffers 146 for the temporary storage of host (user) data during data transfers.

A non-processor based hardware assist circuit 148 may enable the offloading of certain memory management tasks by one or more of the controllers as required. The hardware circuit 148 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 132, such as a data compression block 150 and an encryption block 152. The data compression block 150 applies lossless data compression to input data sets during write operations, and subsequently provides data de-compression during read operations. The encryption block 152 provides any number of cryptographic functions to input data including encryption, hashes, decompression, etc.

A device management module (DMM) 154 supports back end processing operations and may include an outer code engine circuit 156 to generate outer code, a device I/F logic circuit 158 and a low density parity check (LDPC) circuit 160 configured to generate LDPC codes as part of the error detection and correction strategy used to protect the data stored by the by the SSD 130.

A memory module 162 corresponds to the memory 104 in FIG. 1 and includes a non-volatile memory (NVM) in the form of a flash memory 164 distributed across a plural number N of flash memory dies 166. Rudimentary flash memory control electronics (not separately shown in FIG. 3) may be provisioned on each die 166 to facilitate parallel data transfer operations via one or more channels (lanes) 168.

Figure 4:
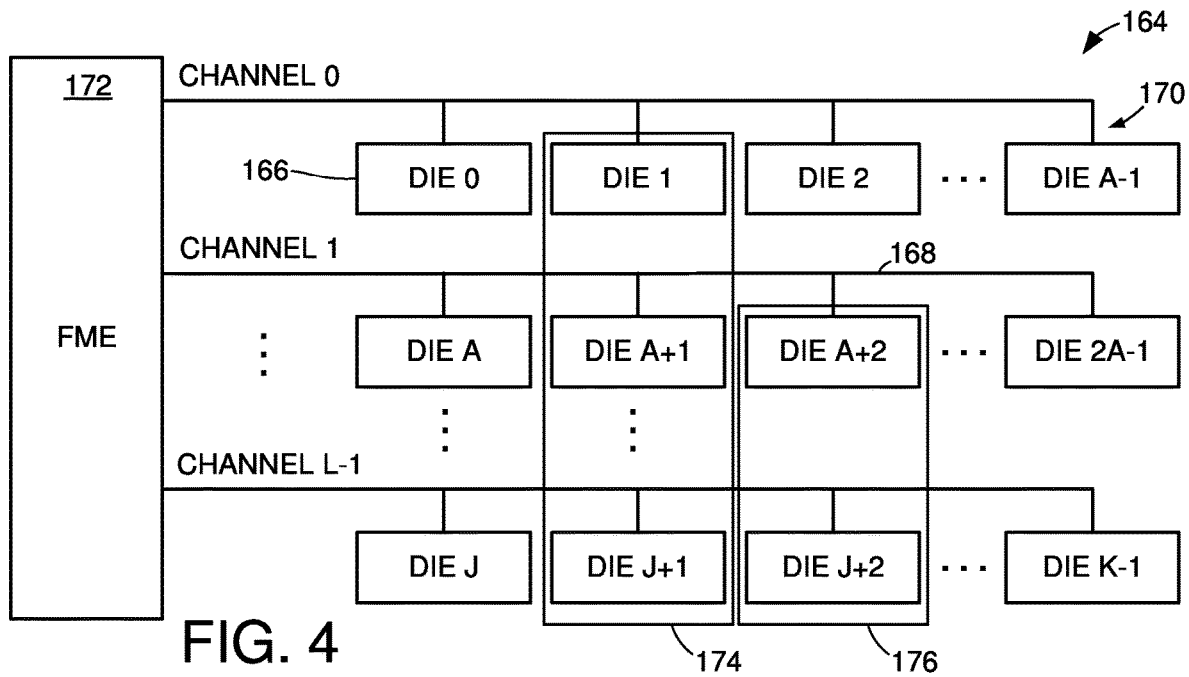
FIG. 4 illustrates the use of channels to access the dies in FIG. 3 in some embodiments.

FIG. 4 shows further aspects of the flash memory 164 arranged in accordance with some embodiments. A total number K dies 166 are provided and arranged into physical die groups 170. Each die group 170 is connected to a separate channel 168 using a total number of L channels. In one example, K is set to 128 dies, L is set to 8 channels, and each physical die group has 16 dies. As noted above, a single die within each physical die group can be accessed at a time using the associated channel. A flash memory electronics (FME) circuit 172 of the flash memory 164 controls each of the channels 168 to transfer data to and from the dies 166.

In some embodiments, the various dies are arranged into one or more NVMe sets. An NVMe set represents a portion of the storage capacity of the SSD that is allocated for use by a particular host (user/owner). NVMe sets are usually established with a granularity at the die level, so that some percentage of the total available dies 166 will be allocated for incorporation into a given NVMe set.

A first example NVMe set is denoted at 174 in FIG. 4. This first set 174 uses a single die 166 from each of the different channels 168. This arrangement provides fast performance during the servicing of data transfer commands for the set since all eight channels 168 are used to transfer the associated data. A limitation with this approach is that if the set 174 is being serviced, no other NVMe sets can be serviced during that time interval. While the set 174 only uses a single die from each channel, the set could also be configured to use multiple dies from each channel, such as 16 dies/channel, 32 dies/channel, etc.

A second example NVMe set is denoted at 176 in FIG. 4. This set uses dies 166 from less than all of the available channels 168. This arrangement provides relatively slower overall performance during data transfers as compared to the set 174, since for a given size of data transfer, the data will be transferred using fewer channels. However, this arrangement advantageously allows the SSD to service multiple NVMe sets at the same time, provided the sets do not share the same (e.g., an overlapping) channel 168.

Figure 5:
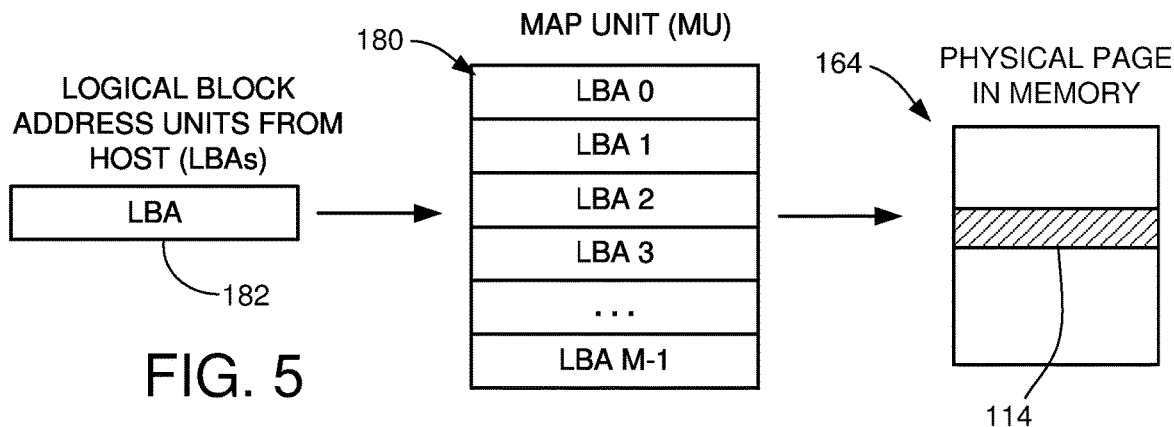
FIG. 5 illustrates a map unit (MU) as a data arrangement stored to the flash memory of FIG. 2.

FIG. 5 illustrates a manner in which data may be stored to a flash memory 164. Map units (MUs) 180 represent fixed sized blocks of data that are made up of one or more user logical block address units (LBAs) 182 supplied by the host. Without limitation, the LBAs 182 may have a first nominal size, such as 512 bytes (B), 1024B (1 KB), etc., and the MUs 180 may have a second nominal size, such as 4096B (4 KB), etc. The application of data compression may cause each MU to have a smaller size in terms of actual bits written to the flash memory 164.

The MUs 180 are arranged into the aforementioned pages 114 (FIG. 2) which are written to the memory 164. In the present example, using an MU size of 4 KB, then nominally four (4) MUs may be written to each page. Other configurations can be used. To enhance data density, multiple pages worth of data may be written to the same flash memory cells connected to a common control line (e.g., word line) using multi-bit writing techniques; MLCs (multi-level cells) write two bits per cell, TLCs (three-level cells) write three bits per cell; XLCs (four level cells) write four bits per cell, etc.

Data stored by an SSD are often managed using metadata. The metadata provide map structures to track the locations of various data blocks (e.g., MUAs 180) to enable the SSD 130 to locate the physical location of existing data. For example, during the servicing of a read command it is generally necessary to locate the physical address within the flash memory 166 at which the most current version of a requested block (e.g., LBA) is stored, so that the controller can schedule and execute a read operation to return the requested data to the host. During the servicing of a write command, new data are written to a new location, but it is still necessary to locate the previous data blocks sharing the same logical address as the newly written block so that the metadata can be updated to mark the previous version of the block as stale and to provide a forward pointer or other information to indicate the new location for the most current version of the data block.

Figure 6:
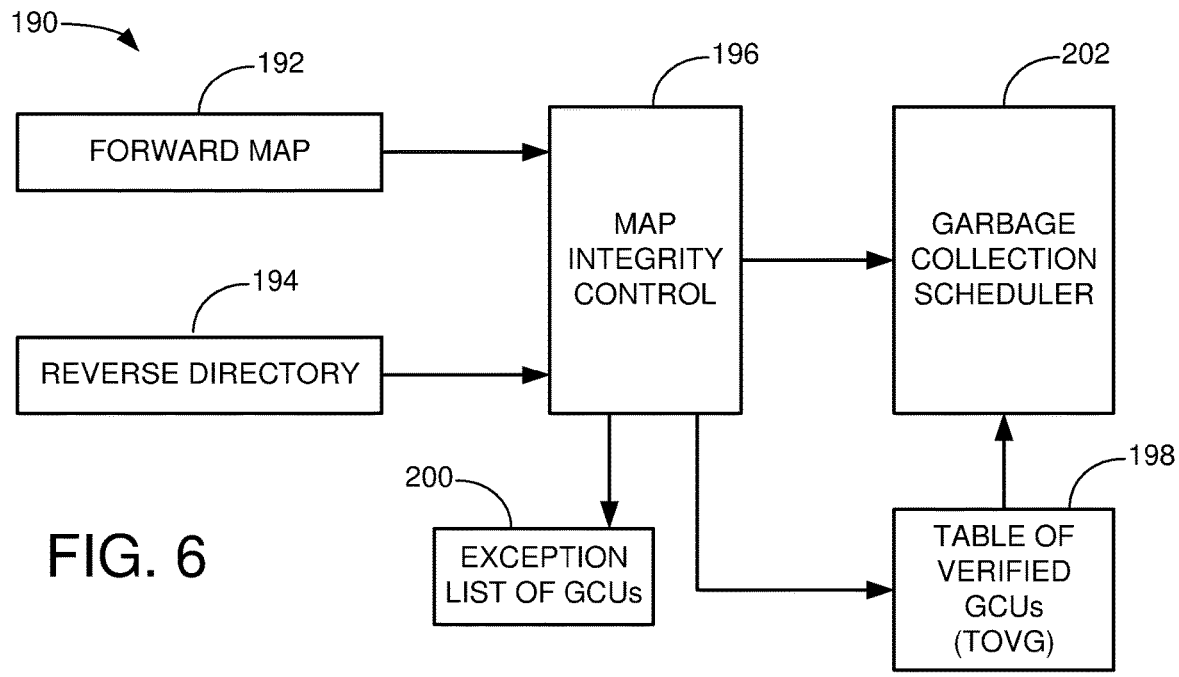
FIG. 6 displays a functional block diagram for a GCU management circuit of the SSD in accordance with some embodiments.

FIG. 6 shows a functional block diagram for a GCU management circuit 190 of the SSD 130 in accordance with some embodiments. The circuit 190 may form a portion of the controller 132 and may be realized using hardware circuitry and/or one or more programmable processor circuits with associated firmware in memory. The circuit 190 includes the use of a forward map 192 and a reverse directory 194. As noted above, the forward map and reverse directory are metadata data structures that describe the locations of the data blocks in the flash memory 164. During the servicing of host data transfer operations, as well as other operations, the respective portions of these data structures are located in the flash memory or other non-volatile memory location and copied to local memory 140 (see e.g., FIG. 3).

The forward map 192 provides a flash transition layer (FTL) to generally provide a correlation between the logical addresses of various blocks (e.g., MUAs) and the physical addresses at which the various blocks are stored (e.g., NVMe set, die, plane, GCU, EB, page, bit offset, etc.). The contents of the forward map 192 may be stored in specially configured and designated GCUs in each NVMe set.

The reverse directory 194 provides a physical address to logical address correlation. The reverse directory contents may be written as part of the data writing process to each GCU, such as in the form of a header or footer along with the data being written. Generally, the reverse directory provides an updated indication of how many of the data blocks (e.g., MUAs) are valid (e.g., represent the most current version of the associated data).

The circuit 190 further includes a map integrity control circuit 196. As explained below, this control circuit 196 generally operates at selected times to recall and compare, for a given GCU, the forward map data and the reverse directory data. This evaluation step includes processing to determine if both metadata structures indicate the same number and identify of the valid data blocks in the GCU.

If the respective forward map and reverse directory match, the GCU is added to a list of verified GCUs in a data structure referred to as a table of verified GCUs, or TOVG 198. The table can take any suitable form and can include a number of entries, with one entry for each GCU. Each entry can list the GCU as well as other suitable and useful information, such as but not limited to a time stamp at which the evaluation took place, the total number of valid data blocks that were determined to be present at the time of validation, a listing of the actual valid blocks, etc.

Should the control circuit 196 find a mismatch between the forward map 192 and the reverse directory 194 for a given GCU, the control circuit 196 can further operate to perform a detailed evaluation to correct the mismatch. This may include replaying other journals or other data structures to trace the history of those data blocks found to be mismatched. The level of evaluation required will depend on the extent of the mismatch between the respective metadata structures.

For example, if the forward map 192 indicates that there should be some number X valid blocks in the selected GCU, such as 12 valid blocks, but the reverse directory 194 indicates that there are only Y valid blocks, such as 11 valid blocks, and the 11 valid blocks indicated by the reverse directory 194 are indicated as valid by the forward map, then the focus can be upon the remaining one block that is valid according to the forward map but invalid according to the reverse directory. Other mismatch scenarios are envisioned.

The mismatches can arise due to a variety of factors such as incomplete writes, unexpected power surges or disruptions that prevent a full writing of the state of the system, etc. Regardless, the control circuit can expend the resources as available to proactively update the metadata. In some embodiments, an exception list 200 may be formed as a data structure in memory of GCUs that have been found to require further evaluation. In this way, the GCUs can be evaluated later at an appropriate time for resolution, after which the corrected GCUs can be placed on the verified list in the TOVG 198.

It will be noted that the foregoing operation of the control circuit 196 in evaluating GCUs does not take place once a garbage collection operation has been scheduled; instead, this is a proactive operation that is carried out prior to the scheduling of a garbage collection operation. In some cases, GCUs that are approaching the time at which a garbage collection operation may be suitable, such as after the GCU has been filled with data and/or has reached a certain aging limit, etc., may be selected for evaluation on the basis that it can be expected that a garbage collection operation may be necessary in the relatively near future.

FIG. 6 further shows the GCU management circuit 190 to include a garbage collection scheduler circuit 202. This circuit 202 generally operates once it is appropriate to consider performing a garbage collection operation, at which point the circuit 202 selects from among the available verified GCUs from the table 198. In some cases, the circuit 202 may generate a time of completion estimate to complete the garbage collection operation based on the size of the GCU, the amount of data to be relocated, etc.

As will be appreciated, a garbage collection operation can include accessing the forward map and/or reverse directory 192, 194 to identify the still valid data blocks, the reading out and temporary storage of such blocks in a local buffer memory, the writing of the blocks to a new location such as in a different GCU, the application of an erasure operation to erase each of the erasure blocks in the GCU, the updating of program/erase count metadata to indicate the most recent erasure cycle, and the placement of the reset GCU into an allocation pool awaiting subsequent allocation and use for the storage of new data sets.

Figure 7:
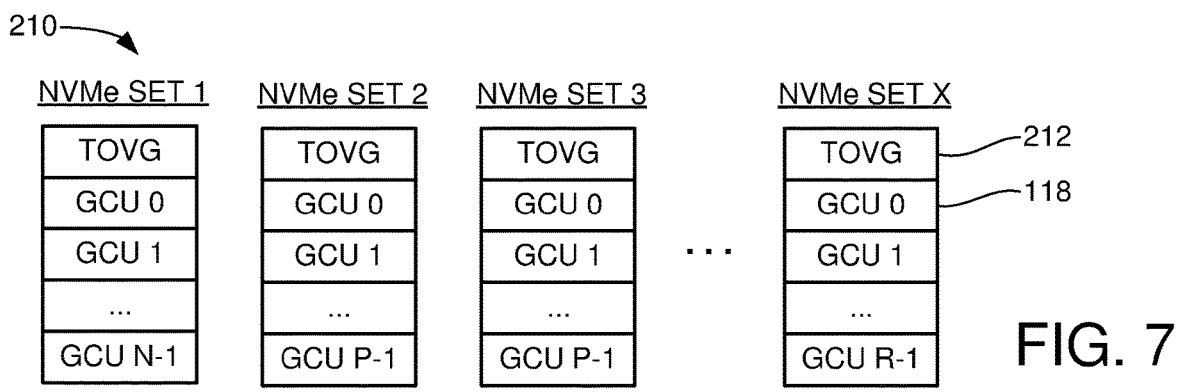
FIG. 7 represents an arrangement of various GCUs and corresponding tables of verified GCUs (TOVGs) for a number of different NVMe sets in some embodiments.

FIG. 7 shows a number of NVMe sets 210 that may be arranged across the SSD 130 in some embodiments. Each set 210 may have the same nominal data storage capacity (e.g., the same number of allocated dies, etc.), or each may have a different storage capacity. The storage capacity of each NVMe set 210 is arranged into a number of GCUs 118 as shown. In addition, a separate TOVG (table of verified GCUs) 212 may be maintained by and in each NVMe set 210 to show the status of the respective GCUs. From this, each time that it becomes desirable to schedule a garbage collection operation, such as to free up new available memory for a given set, the table 212 can be consulted to select a GCU that, with a high degree of probability, can be subjected to an efficient garbage collection operation without any unexpected delays due to mismatches in the metadata (forward map and reverse directory).

Figure 8:
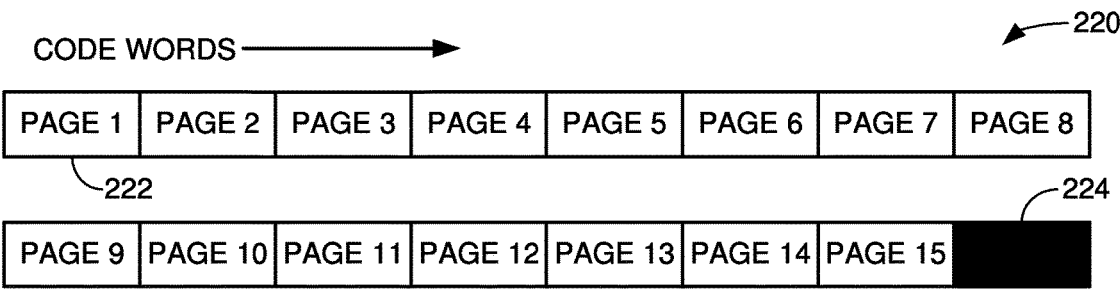
FIG. 8 illustrates an example data set that can be written to the data storage device of FIG. 1 in accordance with assorted embodiments.

FIG. 8 illustrates a manner in which a parity data set 220 can be written to a selected GCU 118 in the flash memory 164 in accordance with some embodiments. In this example, it is contemplated that the selected GCU 118 is formed from sixteen (16) erasure blocks 116, with each of the erasure blocks disposed on a different die 166. Other sizes can be used as desired.

In FIG. 8, the parity data set has fifteen (15) user data pages 222, with each user data page, or payload, written to a different one of the dies. More generally, the GCU has N erasure blocks on a corresponding N dies, and payloads 222 are written to N−1 of the dies. The Nth die receives an outer code (parity value), which is represented at 224. As mentioned above, the outer code may be generated by summing the page data in a buffer using an XOR function. Because the parity data set 220 has data boundaries that nominally match the GCU boundaries, the parity data set in FIG. 8 is referred to as a standard parity data set since the data matches the available memory.

Figure 9:
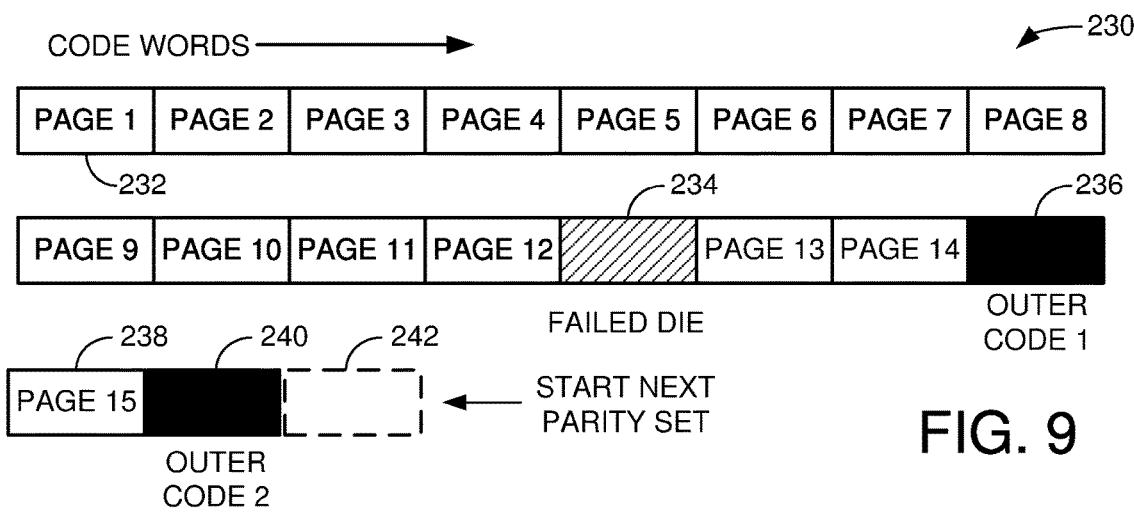
FIG. 9 is an example non-standard data set that may occur in the data storage device of FIG. 1 in accordance with various embodiments.

FIG. 9 shows an example non-standard parity data set 230. The parity data set 230 is the same size as the parity data set 220 in FIG. 8 in that, as before, the parity data set 230 has a total of fifteen (15) pages/payloads 232. However, one of the dies 166 has experienced a failure, as indicated at 234, so that the GCU only spans 15 dies.

Accordingly, the controller circuit 132 (FIG. 3) operates to write a full set of the available pages, which in this case is Page 1 to Page 14, through the available dies. This is followed by the writing of a first outer code (parity value) in the Nth location, as shown at 236, which protects the payloads (Page 1 to Page 14) written during this first pass through the available dies.

A leftover payload 238 (Page 15) is written to the next available page in the first die (such as adjacent Page 1). This leftover payload is referred to as a runt or runt data, and represents the remainder after an integer number of passes have been made through the available dies. Once all of the leftover payloads have been written, a second outer code (parity value) is written in the next available die, as shown at 240. This second outer code is disposed in the same die as, and is adjacent to, the Page 2 payload.

In this way, when leftover (runt) payload sets remain, these are written to as many additional dies as are required, followed by the writing of a final parity value to cover the runts. Map data may be generated to note the non-standard outer code arrangement. This provides a parity data set with a parity value to protect each pass through the dies, plus another parity value to cover the remainder.

While FIG. 9 shows the non-standard parity data set has arisen due to a non-standard sized available memory (e.g., due to the die failure at 234), other non-standard parity data sets can arise based on other factors. For example, a particular data set to be written to a given NVMe set may make up a total number of MUs that do not align with the GCU boundaries. In another case, data compression or other processing may result in a non-standard sized parity data set. It will be appreciated that if a given GCU has N dies, then a non-standard sized data set will have a total number M payloads (or portions thereof) that are not divisible by N without a remainder. The remainder could be any value from one extra payload up to N−1 extra payloads. Regardless, each pass through the dies will be parity protected, irrespective of the overall length of the parity data set.

Once a non-standard parity set is written, map data may be generated and stored to indicate the fact that the parity data set is of non-standard length. Information may be stored in the map data such as how much longer the data set is in terms of additional pages in the remainder, the location of the last parity value (e.g., 240), etc. To maximize data density, the controller may operate to initiate the writing of the next parity data set at the next available page on the next die in the sequence, as shown at 242 in FIG. 9.

Figure 10:
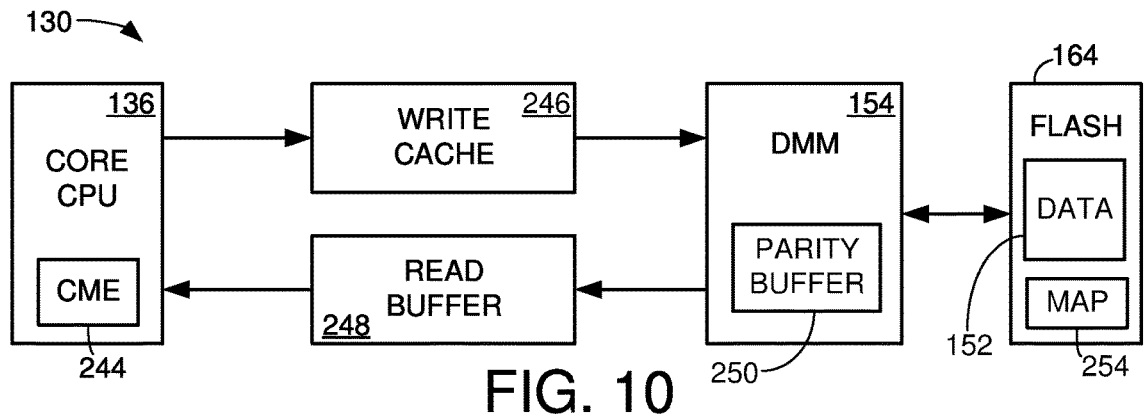
FIG. 10 shows a functional block representation of an example data storage device configured in accordance with some embodiments.

FIG. 10 shows a functional block representation of additional aspects of the SSD 130. The core CPU 136 from FIG. 3 is shown in conjunction with a code management engine (CME) 244 that can be used to manage the generation of the respective code words and outer code parity values for both standard and non-standard parity data sets During write operations, input write data from the associated host are received and processed to form MUs 180 (FIG. 5) which are placed into a non-volatile write cache 246 which may be flash memory or other form(s) of non-volatile memory. The MUs are transferred to the DMM circuit 154 for writing to the flash memory 164 in the form of code words that contain user data, inner code, and outer code. During read operations, one or more pages of data are retrieved to a volatile read buffer 248 for processing prior to transfer to the host.

The CME 244 determines the appropriate inner and outer code rates for the data generated and stored to memory. In some embodiments, the DMM circuit 154 may generate both the inner and outer codes. In other embodiments, the DMM circuit 154 generates the inner codes (see e.g., LDPC circuit 160 in FIG. 3) and the core CPU 136 generates the outer code words. In still other embodiments, the same processor/controller circuit generates both forms of code words. Other arrangements can be used as well. The CME 244 establishes appropriate code rates for both types of code words.

During generation of the outer codes, a parity buffer 250 may be used to successively XOR each payload being written during each pass through the dies. Both payload data 252 and map data 254 will be stored to data locations in flash 164.

Figure 11:
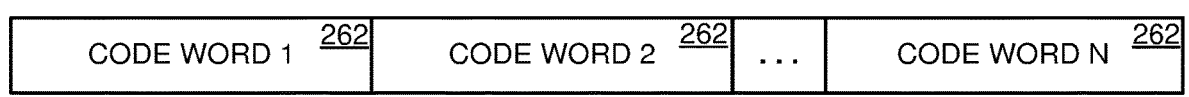
FIG. 11 displays a block representation of portions of an example data storage device arranged in accordance with assorted embodiments.
Figure 11:

FIG. 11 is a block representation of portions of an example data storage device 260 in which data is arranged into a plurality of code words 262 that can efficiently be stored, and retrieved, from one or more SSD storage destinations. A page 150 of data may comprise a number of consecutive, or non-consecutive, code words 262 organized to effectively fit in the available space of an SSD.

As shown, a code word 262 can consist of user data 264 and inner code 266 generated to complement the user data 264, such as by the LDPC circuitry 138. The inner code 266 can provide a diverse variety of capabilities, such as error correction via error correction code (ECC), data status, data offset, and other data control information. The combination of user data 264 and inner code 266 together in a code word 262 allows for efficient analysis, verification, and correction (if necessary) of errors in reading, or writing, the user data 264 to/from memory. However, the inner code 266 may be insufficient, in some cases, to overcome and/or correct errors associated with storage of the code word 262. Hence, various embodiments generate outer code that provides higher-level data analysis and correction in complementary fashion to the inner code 266.

Figure 12:
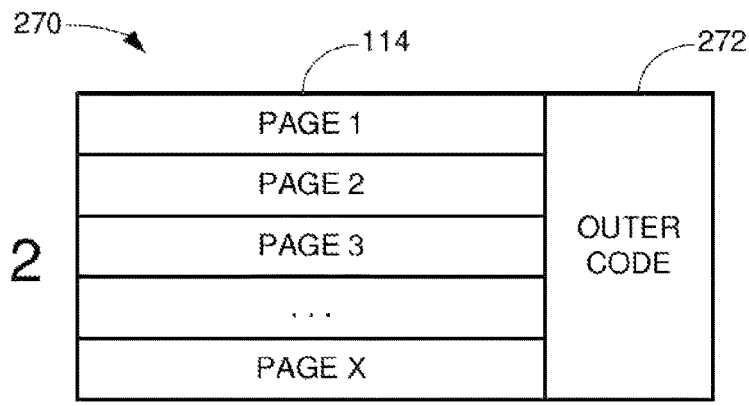
FIG. 12 shows a block representation of portions of an example data storage device configured in accordance with various embodiments.

FIG. 12 conveys a block representation of a portion of an example data storage device 270 where pages 150 of code words 262 are stored in combination with outer code 272 in accordance with some embodiments. The outer code 272 may be associated with one or more pages 150 of code words to provide data that describes the constituent code words 262 and allows for verification and correction of the accuracy, and reliability, of the user data of the respective code words 262.

It is contemplated that the outer code 272 can operate to correct errors and faults that occur during the reading, or writing, of the code words 262. Such corrective function of outer code 272 allows user data to be retrieved despite encountered errors/faults that were uncorrectable by inner code 266. In some embodiments, a probation counter for the user data and/or the physical address of memory where the user data 264 is stored is maintained in the inner code 266, outer code 272, or elsewhere in memory to allow a physical address and/or user data to be monitored in real-time with simple polling of the probation counter. The ability to correct and recover from encountered error during data access operations to a memory provides additional longevity and reliability for a memory and the data stored therein. However, this ability comes at a relatively high system resource price as processing, storage capacity, and time are expended to correct errors and recover data. The use of such system resources can jeopardize the data storage and retrieval performance for some, or all, of a distributed data storage system. Regardless of the sophistication, efficiency, or accuracy of error/failure recovery in a data storage device, the inefficient retrieval of stored data can jeopardize the performance of a data storage device as well as reduce the operational lifespan of the memory constituent in the device.

Figure 13:
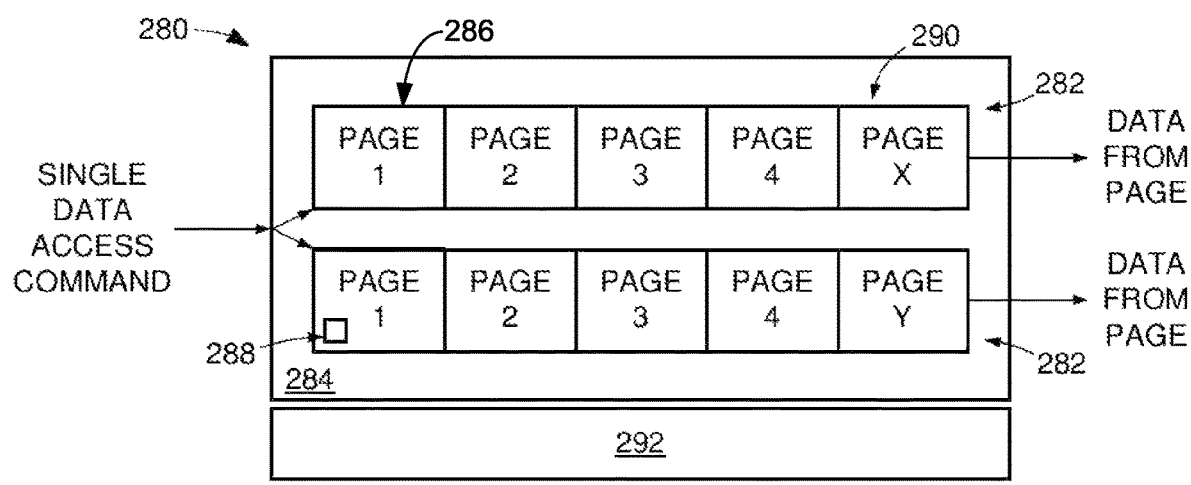
FIG. 13 depicts a block representation of portions of an example solid-state memory in which various embodiments can be practiced.

FIG. 13 depicts a block representation of portions of an example data storage device employing a solid-state memory 280 arranged into physical planes 282 within a single die 284. The respective planes 282 can consist of a number of blocks 286 that can be uniform, or dissimilar, volumes of memory cells 288. It is contemplated that the solid-state memory cells 288 may be individually addressable or addressable only by block 286 or a page 290. That is, the die 284 can be configured so that a single cell 288, page, 290, or block 286 is the smallest individually addressable unit of memory, despite a page 290 and block 286 each comprising multiple separate memory cells 288.

It is noted that while the die 284 is shown in FIG. 13 comprising two planes 282, such arrangement is not required or limiting as more than two planes 282 can be concurrently utilized in a die 284. Various embodiments of the memory 280 access the memory cells of two separate pages 290 in two separate planes 282 with a single data access command identifying a single page address. That is, a single page address can be provided to the die 284 and the control circuitry 292 of the die 284, or individual plane 282, to prompt the retrieval of data from the page address of both planes 282 simultaneously.

Although not required, it is contemplated that the single data access command may provide a reference voltage and/or other settings and parameters in order to read the data at the designated page address. The concurrent retrieval of data from different planes 282 with a single data access command can provide efficient data retrieval, but can be inefficient in terms of the use of the memory and the processing needed to organize the retrieved data. For instance, storing redundant copies of data in pages 290 of different planes 282 can result in reliable data retrieval over time, but at the expense of occupying memory and increasing data processing to disregard a copy of data in the event the single data access request returns two copies of the requested data. Hence, the ability to asynchronously access multiple planes 282 with a single data access request allows for customized data storage and retrieval in accordance with various embodiments.

Figure 14:
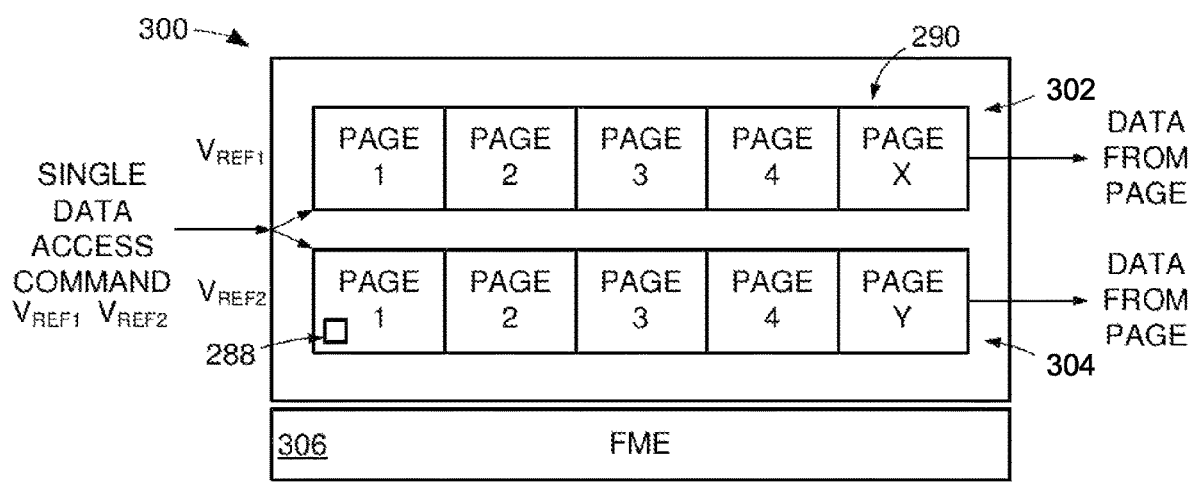
FIG. 14 depicts aspects of an example solid-state memory utilized in accordance with assorted embodiments.

FIG. 14 conveys a block representation of portions of an example solid-state memory die 300 configured as a first plane 302 of pages 290 of memory and a second plane 304 of pages 290 of memory. In response to a single data command to the die 300, the designated pages/cells are retrieved, as directed by the front end electronics (FME) 306 the control operation of the die 300, planes 302/304, pages 290, and cells 288. Unlike the synchronous retrieval of data in FIG. 13 in response to a single data storage command, the embodiment of die 300 provides different reference voltages ($V_{ref1}$ & $V_{ref}$) for the respective planes 302/304 to induce different, asynchronous delivery of the read data to the host that issued the command.

In practice, the different reference voltages operate to provide slightly different data delivery times despite starting the data retrieval at the same time. That is, the single data access command begins retrieving data at the same time, but due to the selected reference voltages, will return the data sequentially at different times instead of simultaneously. The selection of the reference voltages, in some embodiments, is conducted by an asynchronous module 308 that is connected to the die 300 and the respective planes 302/304. The respective reference voltages are selected independently of one another and are customized for the particular planes 302/304 to provide desired data read performance, such as increased reliability, increased latency, or decreased latency.

Generally, the FME 306 interprets the single data access command for a designated page address and supplies the respective reference voltages to the planes 302/304 so that the data stored in the memory cells 288 of the designated page addresses can be retrieved and provided to the requesting host. It is contemplated that the FME 306 directs the respective reference voltages to control circuitry connected to a single plane 302/304, which corresponds with multiple plane control circuitry for each memory die 300. The supplied reference voltages from the single data access command may be overridden, in some embodiments, by default page/cell reference voltages provided by local control circuitry. Hence, although a reference voltage is provided by a received command, the reference voltage actually used to retrieve data may be a different, default memory reference voltage, as decided by an asynchronous module 308 and/or local control circuitry.

Figure 15:
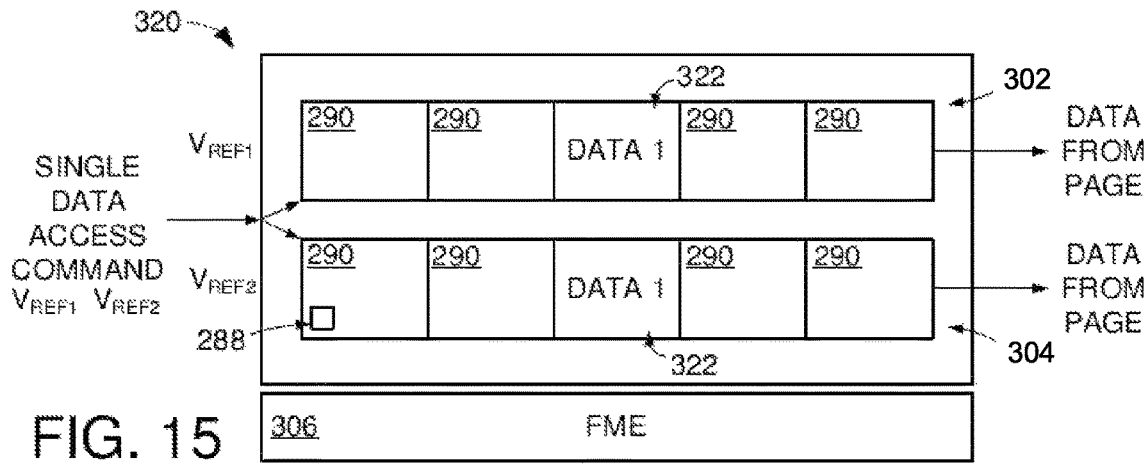
FIG. 15 depicts portions of an example solid-state memory arranged and utilized in accordance with some embodiments.

The example portion of a data storage device 320 shown in FIG. 15 depicts how different reference voltages can be utilized to provide the greatest data access performance. By storing redundant copies of data in pages of different planes 302/304 having the same page address 322, as shown, a single data access command to that page address 322 will return one page of data faster. Such difference can be induced artificially by the asynchronous module 308 by selecting reference voltages that are known to provide different read access latencies or naturally by providing reference voltages that are expected to provide maximum performance, and minimum access latency, but actually produce different access latencies. In other words, the chance of two reference voltages producing an exact same read latency for different pages of memory on different planes is very small.

Figure 16:
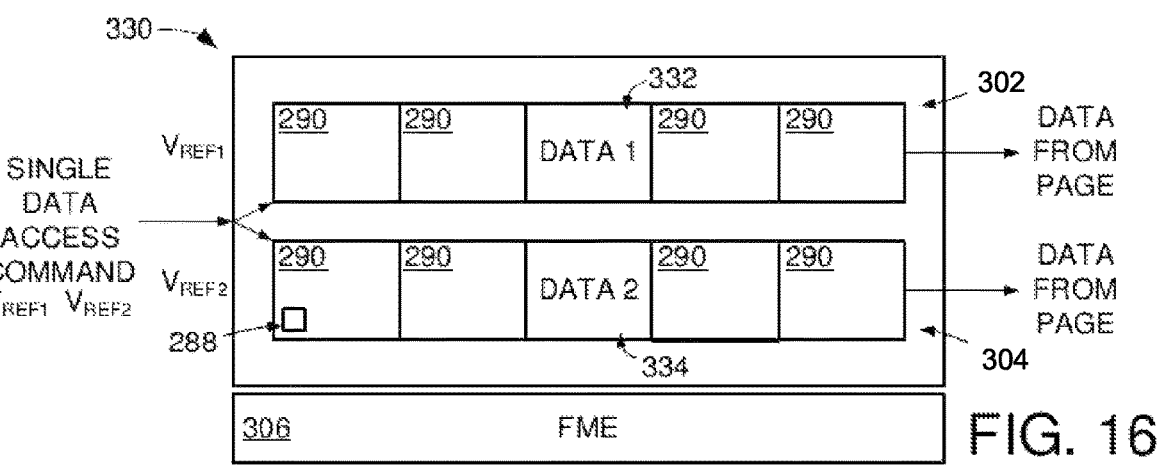
FIG. 16 depicts portions of an example solid-state memory configured and employed in accordance with various embodiments.

FIG. 16 depicts a block representation of portions of another example data storage device 330 where different data 332/334 is stored in the same page address 322 of different planes 302/304. The storage of different data 332/334 allows different reference voltages to be used to ensure sequential data output with a single data access command. The asynchronous module 308 can intelligently select the respective reference voltages based on the data stored in the respective pages, such as data size, error rate, or encryption, as well as the electrical parameters of the memory of the respective pages to provide data output in a desired sequence and with desired read latencies.

Hence, data can be stored in a die of memory to provide increased reliability and performance, by redundantly storing data in different planes, at the cost of using greater amounts of memory or to provide greater sequential data output performance at the cost of increased risk of a data read error rate that could degrade command satisfaction time. The ability to customize data storage for a variety of purposes, such as read latency performance, reliability, or sequential output from a single read request, along with the ability to customize data retrieval via reference voltage selection for the respective planes 282 allows a memory die 284 to provide sophisticated data storage and retrieval optimized to the performance desired for the device 330. The use of different, intelligently selected, reference voltages for different die planes 282 can additionally allow for the passive calibration and optimization of memory cells over time.

Figure 17:
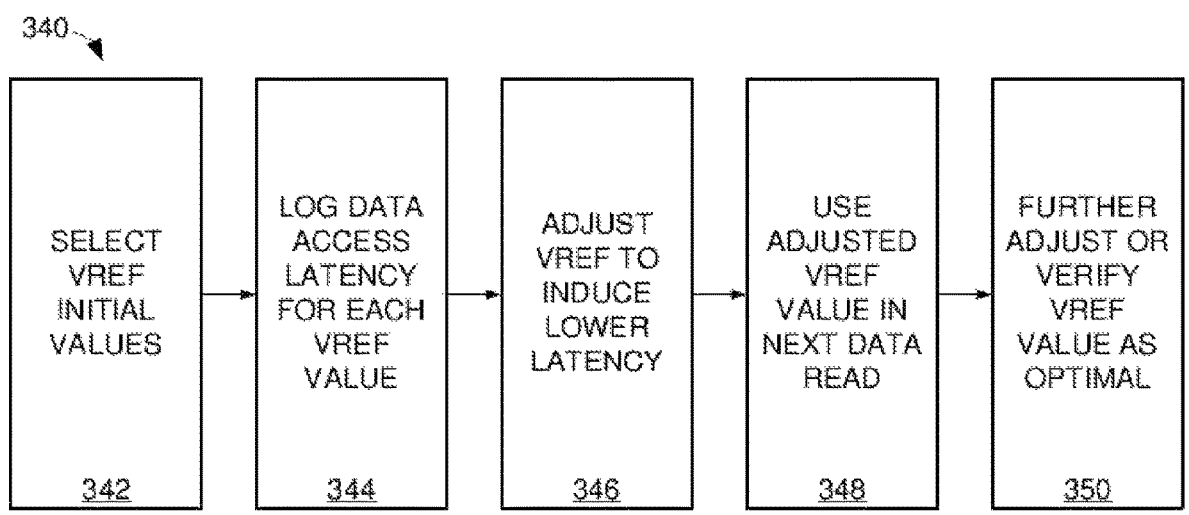
FIG. 17 depicts a timeline of an example passive reference voltage optimization procedure utilized in accordance with some embodiments.

FIG. 17 depicts a timeline of an example passive reference voltage optimization procedure 340 that can be carried out with at least one memory die utilizing multiple planes of solid-state memory cells. Initially, reference voltage values are assigned in step 342 for the respective memory cells. Such reference voltages may be set during manufacturing, by a local calibration controller, or by a remote host. It is contemplated that normal data writing, reading, and erasing of memory cells over time can alter the data storage and retrieval parameters of the respective cells. Thus, step 344 logs data access latency for the memory cells of a memory, such as page, plane, die, or device.

The logged data latencies for data reads and/or writes to memory cells can prompt an asynchronous module to generate an optimization strategy where reference voltages are adjusted in step 346 in an attempt to find an optimal current reference voltage value for at least one memory cell. The asynchronous module can passively test different reference voltages according to an optimization strategy in step 348 during a data read operation. That is, a speculatively adjusted memory cell reference voltage can be tested during the next host-issued data read command to determine if the adjusted voltage value increases, or decreases, data access performance, as measured by the latency of the data read command. Through one or more speculative reference voltage adjustments and tests in step 350, which may be conducted singularly or cyclically with steps 346 and 348, the optimal, current reference voltage value for a memory cell can be determined without employing any superfluous system processing, power, or downtime.

As a non-limiting example of the operation of procedure 340, an asynchronous module can generate a reference voltage optimization strategy that establishes thresholds for when a memory cell needs reference voltage adjustment, such as error rate and/or data access latency, when test reference voltages are to be used, such as when reliability or minimum data access latency are prioritized, and what reference voltages are to be employed, such as a percentage or set deviation from the current reference voltage value. As a result, the asynchronous module can piggy-back on external data access requests to speculatively test and adjust reference voltages to ensure optimal, or closer to optimal than current settings, without degrading system performance or executing extra data access operations on the memory.

Figure 18:
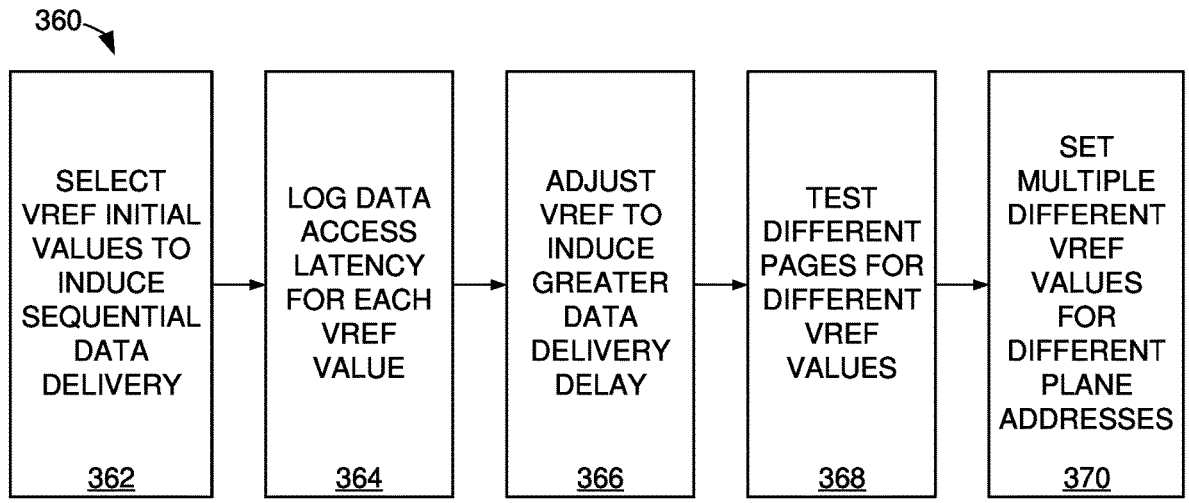
FIG. 18 depicts a timeline of an example sequential data output procedure executed in accordance with assorted embodiments.

While the use of different reference voltages for different planes of memory can be used to test, adjust, and optimize voltage values for cells, different plane reference voltages provided with a single data access command can alternatively be intelligently selected to provide a sequential output of data, which can be particularly useful when different data is stored at the same page address of different planes of memory. FIG. 18 conveys an example sequential data output procedure 360 that can be carried out by solid-state memory cells arranged in separate planes in a die. Step 362 initially selects reference voltage values with an asynchronous module to induce sequential data delivery from a single page address of separate memory planes. It is noted that the memory planes can be part of a single memory calibration group, which corresponds with all memory cells initially calibrated to a uniform data access latency or reference voltage.

The initial sequential data delivery in step 362 is logged in step 364 by the asynchronous module to determine the latency of the respective memory cells of the accessed pages of memory. Knowledge of the data access and delivery latency associated with the assorted memory cells of a plane allows the asynchronous module to adjust the reference voltage(s) provided during a subsequent data access request to the page of memory to create a greater, or lesser, delay. The ability to control the data access and delivery latency allows the asynchronous module, in step 366, to adjust the reference voltage(s) providing during a subsequent data read command to induce a greater delivery delay between the data from different planes. Such greater delivery delay can be useful in some sequential data exporting operations while step 366 may alternatively adjust reference voltages to induce a smaller delivery delay, which may be useful in other data exporting operations.

It is contemplated that some sequential data requests are agnostic with respect to the time between data delivery from different planes. In such cases, step 368 can use the lack of time restraints to test different reference voltages for the accessed pages of memory. Such testing can be conducted in accordance with cell optimization, as conveyed in procedure 340, or can be conducted in accordance with a sequential strategy where, perhaps sub-optimal, reference voltages are discovered to reliably provide a consistent data access latency for a page of memory, which can be used to provide a variety of different sequential data delivery times. The memory testing of step 368 allows step 370 to set multiple different reference voltages for a single page address to induce a diverse variety of sequential data access and delivery time frames and/or delays between data delivery from a single data access command.

Figure 19:
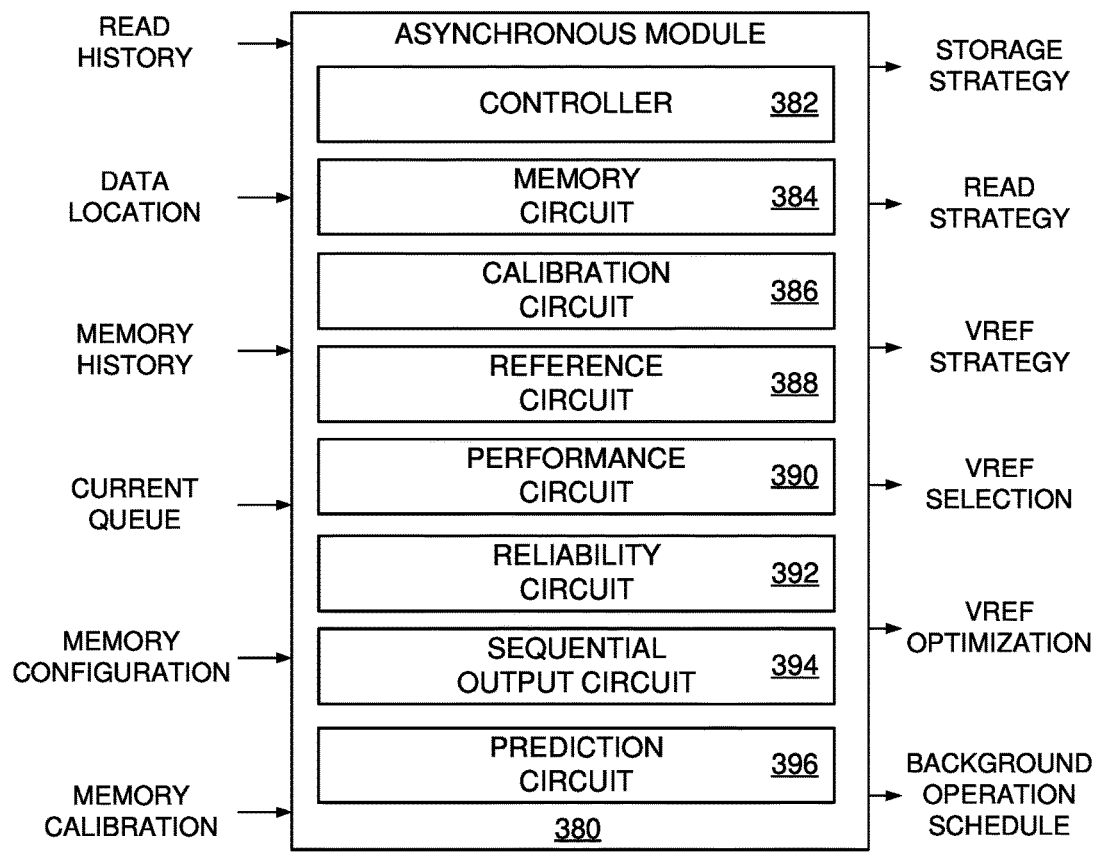
FIG. 19 depicts a block representation of an example asynchronous module configured and operated in accordance with embodiments of a solid-state memory.

FIG. 19 depicts a block representation of an example asynchronous module 380 that can be employed in a data storage device and system in accordance with various embodiments to provide optimized utilization of a single data access command to a die containing multiple planes of memory. It is noted that portions of the module 380 can be resident in any component of a distributed data storage system as hardware and/or software that conditions various input information into at least data storage, data read, and reference voltage strategies.

A module controller 382 may be any programmable circuitry, such as a microprocessor or microcontroller, capable of translating input information, such as past logged memory operational parameters along with data read and storage information as well as current data access queues and memory operational calibrations, to generate real-time and proactive strategies aimed to optimize multiple planes of memory resident in a single die. The module controller 382 can act alone and in conjunction with one or more other module circuitry to detect, analyze, and translate input information into the assorted strategies, reference voltage values and memory background operation schedules.

The module 380 can have a memory circuit 384 that assesses the current and past operational parameters of the various memory connected to the module 380. The memory circuit 384 can track one or more memory metrics, such as capacity, read latency, read count, erase count, write count, page size, physical data address map, logical data address map, and error count, to identify the current memory configuration and reliability of the respective memory cells, planes of memory pages, and dies of memory planes. For instance, the memory circuit 384 can translate logged memory configuration and activity into physical data page addresses that can be reliably manipulated with varying reference voltages to provide different data read latencies.

A calibration circuit 386 of the asynchronous module 380 can track, log, and interpret at least the reference voltage calibrations of memory cells, planes of memory, and dies of memory planes to identify the size, age, reliability, and risk of successful reference voltage manipulation to induce different data read characteristics. The calibration circuit 386 can identify the physical and logical data addresses of various reference voltage calibration groups, which correspond with uniform calibration settings, such as calibration origin, reference voltage value, or calibration schedule. As such, the calibration circuit 386 can provide calibration information about particular memory cells, planes, and die that are more likely to operate error-free for a variety of different reference voltages. That is, the calibration circuit 386 can provide the current calibration groups and reference values of planes of memory along with which page addresses in those planes are calibrated to accurately operate for different reference voltages to provide different data read latencies reliably.

A reference circuit 388 can complement the calibration circuit 386 and allow the module controller 382 to track the current reference voltages of various memory cells and the past reference voltage values that have been used to produce varying data read latencies. It is contemplated that the reference circuit 388 can translate past reference voltage values into one or more future reference voltage values that are adjusted to provide increasing, or decreasing, data read latency, which can be characterized as Vref selection. The reference circuit 388 may, in some embodiments, generate different reference voltage values for particular planes of memory and/or pages of memory cells resident in a plane to passively optimize the current memory calibration, which can be characterized as Vref optimization.

While the reference circuit 388 can generate reference voltage values for assorted portions of memory, a performance circuit 390 can monitor one or more data access activity for various data addresses to identify current and past data access capabilities. For example, the performance circuit 390 can log the data accesses to memory cells and the resulting execution latency and error rate to identify memory cells, and page addresses, that have a greater chance of providing reliable varying data read latencies for different reference voltage values. A reliability circuit 392 can operate with the performance circuit 390, when necessary, to log data errors and failures in order to identify which portions of memory can be manipulated via reference voltage values to provide different data read latencies. It is contemplated that the reliability circuit 392 can identify which pages of memory are ripe for passive re-calibration or reference voltage optimization based on logged data access activity, performance, and error/failure rate.

Through the function of the assorted portions of the asynchronous module 380, a data storage strategy can customize the physical data page address and type of data stored to a memory die. The asynchronous module 380 may further customize the manner in which data is read from a single data page address with a read strategy. Such a read strategy can involve a sequential data output from a single data access command. A sequential output circuit 394 can provide one or more sequential data output scenarios for the read strategy. For instance, the sequential output circuit 394 can provide a range of data delays that are possible between data delivery from different planes by providing a single read request to a data page address. Accordingly, the module controller 382 can construct the read strategy with multiple different sequential data output delays that can be induced with different reference voltage values to allow for the optimal customization of data output for a given data access environment.

The various circuitry of the asynchronous module 380 can interpret past and current memory and data storage information to generate portions of assorted storage, read, and reference voltage strategies. A prediction circuit 396 interprets the past and current information to forecast one or more future conditions and/or performance characteristics, which allows the assorted strategies to proactively adapt to changing memory and/or data access conditions to provide customized optimal data storage location and reference voltage selection to produce the desired data output. The prediction circuit 396 can forecast one or more results to hypothetical data storage and retrieval conditions to allow the module controller 382, and any other module circuitry, to adjust at least the reference voltage values provided to induce optimal data performance, reliability, or sequential data output.

Figure 20:
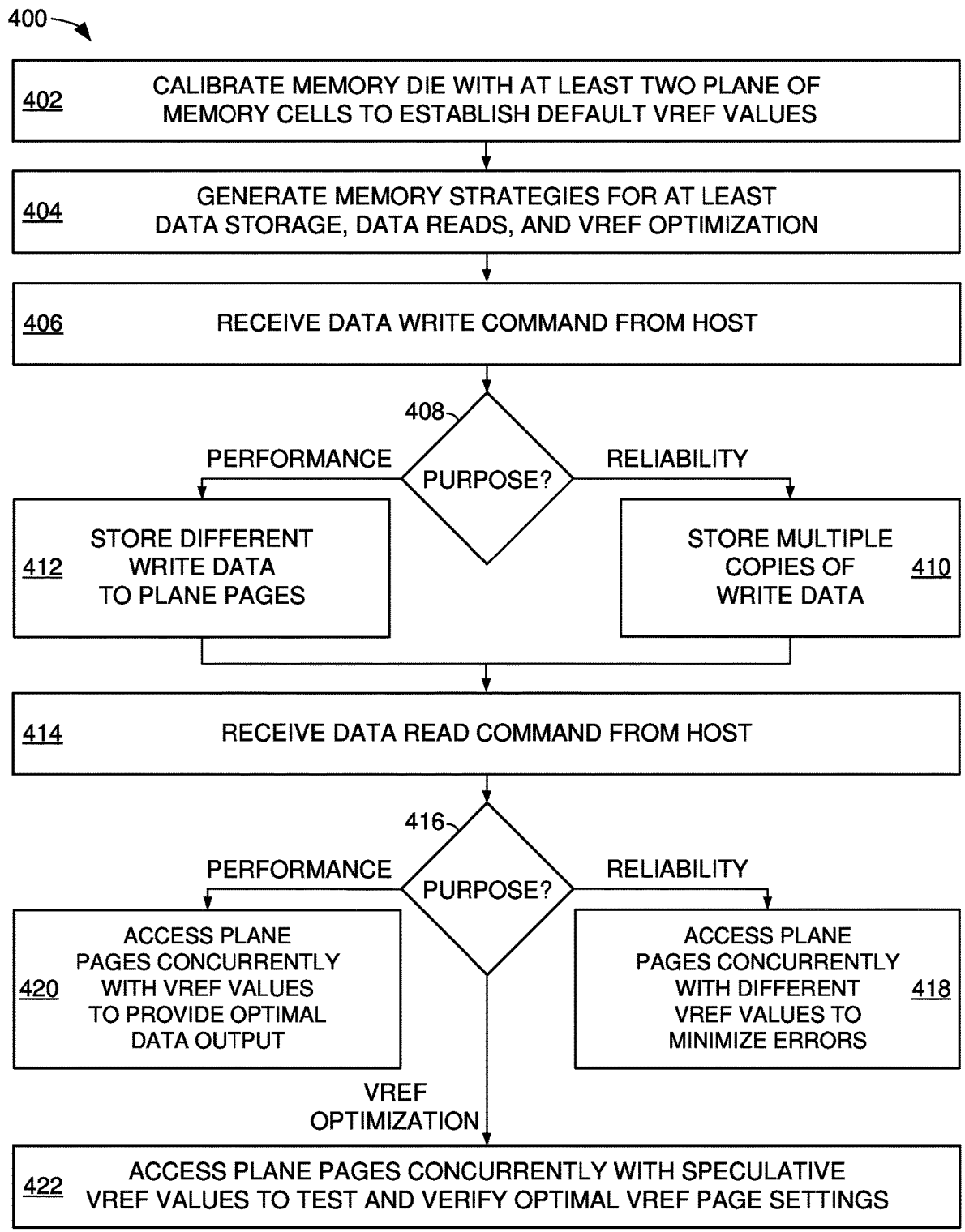
FIG. 20 is a flowchart of an example asynchronous read routine that can be carried out with the various embodiments of FIGS. 1-19.

FIG. 20 depicts a flowchart of an example asynchronous read routine 400 that can be executed with the asynchronous module of FIG. 19 as part of a solid-state memory. Initially, the routine 400 calibrates at least one memory die as part of a single calibration group in step 402. Such calibration consists of the testing and assignment of a default reference voltage calibration setting for each memory cell of multiple planes of memory in a die. The calibrate reference voltage can be a physical parameter, such as resistance and/or voltage, that demarcates between logical cell values. It is contemplated that the default reference voltage calibration setting can consist of multiple parameters in the case of a memory cell having more than two logical values, such as multi-level memory configurations.

The default calibration settings from step 402 allow an asynchronous module to generate one or more memory strategies in step 404 to provide optimized data storage, reading, and reference voltage calibration. The assorted strategies generated in step 404 can prescribe more than one proactive and/or reactive adaptation to data access activity, memory status, and desired data read characteristics so that the asynchronous module does not have to generate a new reactive action/adaptation in response to a detected data or memory condition or activity.

With the memory and data handling strategies in place from step 404, a solid-state memory is prepared to conduct host activity. Step 406 then receives a data write command from a host external to the solid-state memory. The data write command can correspond with write data that can be assigned to a particular logical, or physical, data address by the requesting host. In some embodiments, the write data in step 406 is not assigned a physical data address until the asynchronous module determines the purpose of the data in decision 408. If the perceived, predicted, or detected purpose of the data is for reliable data retrieval at a later time, step 410 stores multiple copies of the same write data in a single common page address of multiple planes of memory in a die.

In the event maximum data retrieval performance, such as minimal data read latency or sequential data output, is the purpose of the write data, step 412 stores different write data to different planes with each data having a single common page address. Regardless of the purpose of the write data, once the data is stored step 414 receives a data read command from a host external to the solid-state memory that requests data, a page address, or a combination of the two. In response to the read request, the asynchronous module determines a purpose of the read in decision 416. If a data reliability purpose is detected or predicted by the asynchronous module, step 418 accesses a common page address of different planes concurrently with a single command consisting of multiple different reference voltage values selected to minimize errors. That is, step 418 can select reference voltage values that can sacrifice data read latency to increase the probability that data will be returned to the host without error or failure.

A performance purpose of a data read request prompts step 420 to access a single common page address of different planes of a die concurrently with reference voltage values selected to provide optimal data output, such as minimal data read latency or prescribed sequential data sequence. In other words, step 420 can select different reference voltage values for different planes of memory in order to achieve the fastest possible read execution time from one of the plane page addresses or to achieve a desired sequence of sequential data outputs separated by a specified delay. The ability to dissect the purpose of a data read and select different reference voltage values in order to fulfill that purpose allows a solid-state memory to utilize multiple planes of memory in a die intelligently and optimally.

The purpose of a data read may also be agnostic to reliability or a specific performance. In such cases, the asynchronous module can conduct passive reference voltage optimization in step 422 by accessing a page address of different planes concurrently with a single data access command consisting of reference voltage values selected to test and verify the operating conditions of memory cells of the respective pages as optimal. The activity of step 422 can be conducted passively during the satisfaction of data read commands, which saves system resources from being dedicated to memory cell/page/plane reference testing and/or calibration alone.

If the testing of reference voltage calibration in step 422 discovers sub-optimal settings, the asynchronous module can adjust the calibration setting of at least one memory cell to ensure the current calibration is the best possible calibration for data access performance and/or reliability. As a non-limiting example of step 422, an asynchronous module can select one non-speculative reference voltage for a plane that is known, or reliably expected, to return stored data and a speculative reference voltage for a separate plane to test, calibrate, or verify the logical memory settings and voltage demarcations of a page of memory at the same page address as the non-speculative reference voltage.

Through the assorted embodiments of an asynchronous module and a solid-state memory, a die of memory consisting of multiple separate planes accessed concurrently with a single data page address command can have optimized data storage, retrieval, and memory calibration. The ability to customize the storage of data for varying purposes as well as customize the reading of data for an array of purposes allows multiple planes of memory to be utilized in manners most conducive to the practical application of the solid-state memory. The passive calibration of memory in conjunction with a single data access command allows data storage system resources to be focused on servicing various connected hosts and host requests instead of conducting time consuming memory calibration and testing in isolation.

What is claimed is:

1. A method comprising:
accessing a solid-state memory comprising non-individually erasable memory cells arranged into dies, each die comprising a first plane and a second plane;
receiving a single read command from a host connected to the solid-state memory;
generating a first reference voltage and a second reference voltage using a controller to produce asynchronous data retrieval, the reference voltages being different and selected by the controller to induce a predetermined delay between retrieval of data from the first plane and retrieval of data from the second plane from the single read command;
passing each reference voltage concurrently to a common single data address of the first plane and the second plane;
retrieving data from the common single data address of the first plane with a first latency; and
retrieving data from the common single data address of the second plane with a second latency, the first latency being faster than the second latency.

2. The method of claim 1, wherein the first plane and the second plane are each physically present on a single die in a data storage device.

3. The method of claim 1, wherein the controller selects the first reference voltage and the second reference voltage to produce a predetermined delay between retrieval of data from the respective first plane and second plane from the single read command.

4. The method of claim 1, wherein the controller selects the first reference voltage and the second reference voltage in response to predicted purpose of the single read command.

5. The method of claim 2, wherein the predicted purpose is data reliability and the controller selects the first reference voltage and second reference voltage to minimize data reading errors.

6. The method of claim 1, wherein the controller selects the first reference voltage and the second reference voltage in response to a detected purpose of the single read command.

7. The method of claim 6, wherein the detected purpose is data reading performance and the controller selects the first reference voltage and second reference voltage to minimize data reading latency, the respective first reference voltage and second reference voltage each being different than a default reference voltage.

8. The method of claim 1, wherein the first reference voltage and second reference voltage are different deviations from a default reference voltage set for the respective memory cells corresponding to the single data address of the first plane and second plane.

9. The method of claim 1, further comprising generating an optimization strategy with the controller in response to receipt of the single read command and executing the optimization strategy to test a reference voltage for at least one memory cell of the first plane and at least one memory cell of the second plane concurrently, the test reference voltage prescribed by the optimization strategy, wherein the test reference voltage is speculative and verifies an operating condition of the memory cells of the respective planes as optimal.

10. The method of claim 9, wherein the optimization strategy is executed passively by the controller during satisfaction of the single read command to a different data address of the first plane and the second plane.

11. The method of claim 9, wherein the optimization strategy prescribes a plurality of different reference voltages to be employed to determine an optimal reference voltage corresponding with a lowest read latency for a selected one of the at least one memory cell of the first plane or the at least one memory cell of the second plane.

12. The method of claim 9, wherein the optimization strategy prescribes a plurality of different reference voltages to be employed to determine an optimal reference voltage corresponding with a lowest error rate for a selected one of the at least one memory cell of the first plane or the at least one memory cell of the second plane.

13. The method of claim 9, wherein the optimization strategy tests multiple different data addresses for the respective first plane and second plane.

14. The method of claim 13, wherein the multiple different addresses are assigned different optimized reference voltages as a result of execution of the optimization strategy.

15. The method of claim 14, wherein the different optimized reference voltages are set by the controller as percentage deviations from a default reference voltage for each memory cell of the respective data addresses.

16. An apparatus comprising:
a solid-state memory comprising non-individually erasable memory cells arranged into dies, each die comprising a first plane and a second plane; and
a controller circuit configured to, responsive to receipt of a single read command from a host connected to the solid-state memory, generate a first reference voltage and a second reference voltage to produce asynchronous data retrieval, the first and second reference voltages being different and configured to induce a predetermined delay between retrieval of data from the first plane and retrieval of data from the second plane from the single read command, the controller circuit further configured to pass each of the first and second reference voltages concurrently to a common single data address of the first plane and the second plane, to retrieve data from the common single data address of the first plane with a first latency, and to retrieve data from the common single data address of the second plane with a second latency, the first latency being faster than the second latency.

17. The apparatus of claim 16, characterized as a solid-state drive (SSD).

18. The apparatus of claim 16, wherein the solid-state memory comprises a flash memory.

19. The apparatus of claim 16, wherein the common single data address describes a selected page of the non-individually erasable memory cells.

20. The apparatus of claim 16, wherein the common single data address describes a selected erasure block of the non-individually erasable memory cells.

* * * * *